United States Patent [19]

Ishigaki et al.

[11] 4,016,374

[45] Apr. 5, 1977

[54] MULTICHANNEL RECORD DISC RECORDING SYSTEM WITH SIGNAL LEVEL CONTROL

[75] Inventors: Yukinobu Ishigaki, Yamato; Hiroshi Matsushima, Neyagawa, both of Japan

[73] Assignees: Matsushita Electric Industrial Co., Ltd., Kadoma; Victor Company of Japan, Limited, Yokohama, both of Japan

[22] Filed: June 23, 1975

[21] Appl. No.: 589,557

[30] Foreign Application Priority Data

June 25, 1974 Japan .............................. 49-72542

[52] U.S. Cl. ...................... 179/100.4 ST; 179/1 G
[51] Int. Cl.² ...................... G11B 3/00; H04H 5/00
[58] Field of Search ............... 179/100.4 ST, 1 GQ, 179/100.1 TD; 178/6.6 R

[56] References Cited

UNITED STATES PATENTS

| 3,772,479 | 11/1973 | Hilbert ...................... 179/100.4 ST |
| 3,806,667 | 4/1974 | Ishigaki .......................... 179/1 GQ |
| 3,812,295 | 5/1974 | Bauer ............................. 179/1 GQ |
| 3,895,191 | 7/1975 | Koganezawa ............. 179/100.4 ST |
| 3,934,087 | 1/1976 | Takahashi ................ 179/100.4 ST |

*Primary Examiner*—Jay P. Lucas

[57] ABSTRACT

A multichannel record disc recording system comprises operation circuits for forming first and second sum signals and first and second difference signals respectively, from the signals of two pairs of channels, or a total of four channels. The first and second difference signals are angle modulated. When at least one of the first and second sum signals exceeds a predetermined level, a control signal is formed to control the levels of the first and second angle-modulated difference signals. The first sum signal and the first angle-modulated difference signal are level controlled and multiplexed. The second sum signal and the second angle-modulated difference signal are also level controlled and multiplexed thereby to produce multiplexed signals for recording on a record disc.

6 Claims, 11 Drawing Figures

MULTICHANNEL RECORD DISC RECORDING SYSTEM WITH SIGNAL LEVEL CONTROL

BACKGROUND OF THE INVENTION

The present invention relates generally to multichannel record disc recording systems, and more particularly to a system which, automatically controls the level of an angle-modulated wave signal in accordance with the level of a direct wave signal. The direct wave signal is superimposed on an angle-modulated wave signal and recorded, as thus superimposed, on a record disc.

A 4-channel record disc recording system was previously described in U.S. Pat. Nos. 3,686,471 and 3,883,699, which has already been reduced to practice signals from two channels are matrixed thereby to obtain, respectively, sum and difference signals. Then, a carrier wave is angle modulated with the difference signal. The resulting angle-modulated difference signal is multiplexed with a direct wave sum signal, and the signals thus multiplexed are recorded on one sidewall of a groove on the record disc. Another two channels are recorded on the other sidewall, in a similar manner.

If the levels of the respective channel signals are high, interference will readily occur between the high-frequency band component and the angle-modulated wave difference signal of the direct wave sum signal, at the time of recording of the 4-channel record disc. A similar interference may also occur at the time of reproducing by means of a pickup cartridge. In such a case, the interference will give rise to various problems such as disturbance noise, impairment of the signal-to-noise (S/N) ratio, and deterioration of the distortion factor.

Accordingly, one conceivable measure for preventing these adverse effects is to keep the angle-modulated wave difference signal at a high level. However, when the level of the angle-modulated wave difference signal is so maintained at a high value, the cutter head generates heat while cutting and recording on the disc. The heat requires special gas cooling means of an elaborate scale and high cost.

Accordingly, we have previously described a system intended to solve these problems. That system is disclosed in U.S. Pat. No. 3,806,667, entitled FOUR CHANNEL PHONOGRAPH MULTIPLEX RECORDING SYSTEM WITH SIGNAL LEVEL CONTROL. This system has a device for reproducing a magnetic tape on which program signals are recorded. An auxiliary head is provided ahead or upstream of the regular reproducing head, as viewed in the tape traveling direction. A signal reproduced by this preceding head is passed through a number of circuits, such as an equalizer circuit, a gate circuit, a delay circuit, and an integration circuit, to obtain a control signal which varies in accordance with the level of the reproduced signal. By this control signal, the level of the angle-modulated wave difference signal is automatically controlled.

This system requires a separate transmission line for the regularly reproduced 4-channel signals and for the control signal obtained from the preceding auxiliary head. For this reason, it is necessary to readjust the level of the control signal where the signal level (cutting level) is set in the 4-channel signal transmission system. Furthermore, this previous system requires the preceding auxiliary head, and the magnetic tape reproducing device becomes complicated. In addition, there are problems caused by the complicated nature of the circuit system required to obtain the above mentioned control signal. It is necessary to use a disc cutting apparatus which is large and elaborate, and is troublesome to adjust.

SUMMARY OF THE INVENTION

Accordingly, it is a general object of the present invention to provide a novel and useful multichannel record disc recording system with signal level control in which the above described problems have been solved.

Another object of the invention is to provide a system with automatic level control, wherein the level of a direct wave signal controls the level of an angle-modulated wave signal which is multiplexed with the direct wave and recorded on a record disc. In the connection, an object is to provide a system in which there is no interference at the time of the reproduction of a multichannel disc which has been recorded by the system of the present invention. There is no interference between the high-frequency component of the direct wave signal and the angle-modulated wave difference signal. There are none of the previous deleterious effects such as a lowering of the S/N ratio and deterioration of the distortion factor characteristic due to disturbance noise. Furthermore, a control signal is obtained from the direct wave signal for controlling the level of the angle-modulated wave signal. Neither the preceding auxiliary head nor the transmission system for the signal reproduced by this head, is required. Therefore, or compared to the above mentioned systems, the inventive recording system is a simple organization.

A further object of the invention is to provide a system for multiplexing a direct wave signal and an angle-modulated wave signal and for recording the resulting signal on a record disc. The system accomplishes the automatic level control so that the level of the angle-modulated wave signal becomes high during the periods while the level of the direct wave signal is higher than a predetermined level.

Other objects and further features of the invention will be apparent from the following detailed description when read in conjunction with the accompanying drawings.

DETAILED DESCRIPTION

Figure 1:
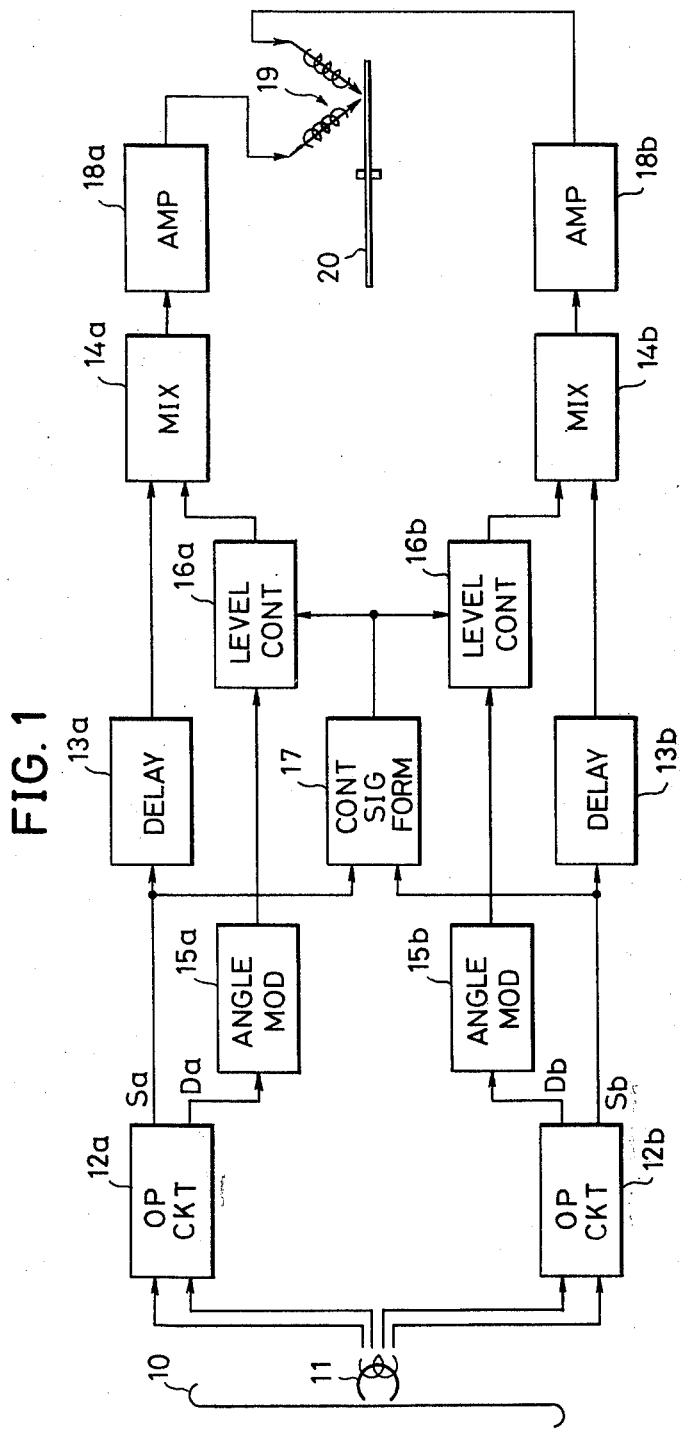
FIG. 1 is a block diagram showing essential organization of one embodiment of a multichannel record disc recording system according to the invention.

One embodiment of the multichannel record disc recording system of the invention will first be described with reference to FIG. 1, which is a simplified block diagram thereof. On a magnetic tape 10, signals CH1 through CH4 of first through fourth channels are recorded on four separate tracks. Each channel signal is reproduced by a reproducing head block 11. The reproduced first and second channel signals CH1 and CH2 are supplied to an operation circuit 12a, while the reproduced third and fourth channel signals CH3 and CH4 are supplied to an operation circuit 12b.

An output sum signal Sa (CH1 + CH2) of the operation circuit 12a is passed through a delay circuit 13a and supplied to a mixer 14a. An output difference signal Da (CH1 − CH2) is simultaneously angle modulated by an angle modulator 15a and then supplied to a level control circuit 16a.

Similarly, an output sum signal Sb (CH3 + CH4) of the operation circuit 12b is passed through a delay circuit 13b and supplied to a mixer 14b. An output difference signal Db (CH3 − CH4) is angle modulated by an angle modulator 15b and then supplied to a level control circuit 16b.

The output sum signals Sa and Sb of the operation circuits 12a and 12b are simultaneously supplied to a control signal forming circuit 17. A control signal is thereby formed as described hereinafter. The resulting control signal thus formed by the control signal forming circuit 17 is impressed on the level control circuits 16a and 16b, and simultaneously controls the level of the angle-modulated difference signals supplied from the angle modulators 15a and 15b. These angle-modulated difference signals thus level controlled are respectively supplied to the above mentioned mixers 14a and 14b. They respectively mixed and multiplexed with the direct wave sum signals Sa and Sb which have passed through the delay circuits 13a and 13b.

The resulting multiplexed signals are produced as output from the mixers 14a and 14b and are respectively amplified by amplifiers 18a and 18b. Then, they are supplied respectively to the left and right driving coils of a cutter head 19, which records them, respectively, on the left and right walls of the same groove on a disc 20.

Figure 2:
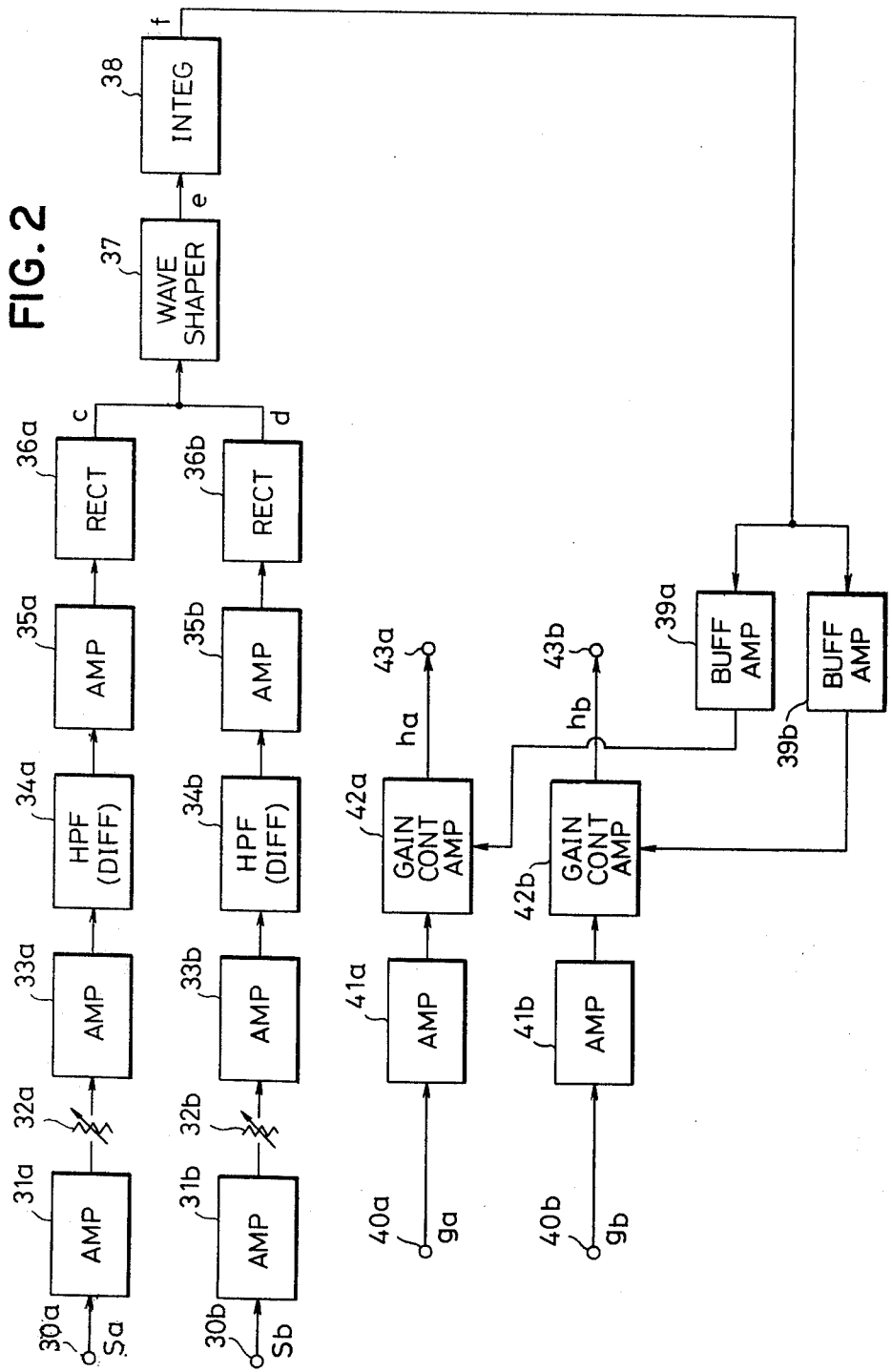
FIG. 2 is a block diagram showing one embodiment of an essential part of the system illustrated in FIG. 1.

FIG. 2 shows one embodiment of a specific block diagram of the part of the above mentioned control signal forming circuit 17 and the level control circuits 16a and 16b.

Figure 3:
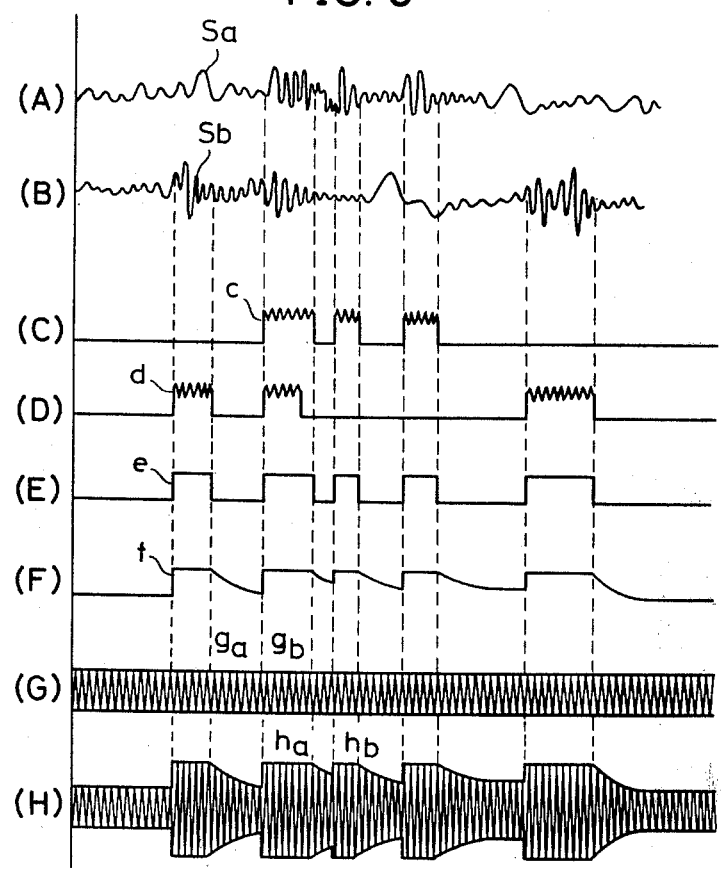
FIGS. 3(A) through 3(H) are time charts respectively indicating signal waveforms at various parts of the block diagram of FIG. 2.

Sum signals Sa and Sb of the waveforms indicated in FIGS. 3(A) and 3(B) are supplied from the operation circuits 12a and 12b and introduced through input terminals 30a and 30b respectively. From there the signals pass through amplifiers 31a and 31b, level adjusters 32a and 32b, and amplifiers 33a and 33b. Then they fed to high-pass filters (differentiation circuits) 34a and 34b. Each of the high-pass filters 34a and 34b is a kind of equalizer circuit for compensating for the characteristics of the reproducing system, including the pickup cartridge. The output high frequency range signal components of the high-pass filters 34a and 34b are amplified by amplifiers 35a and 35b. Then envelopes of parts above specific levels are detected by rectifiers 36a and 36b, in accordance with the frequencies. Then, as indicated in FIGS. 3(C) and 3(D), detection signal $c$ and $d$ correspond to parts above specific levels of high frequency range signal components of the input signals Sa and Sb, indicated in FIGS. 3(A) and 3(B).

The detection signals $c$ and $d$ are waveshaped by a succeeding wave shaper 37. As indicated in FIG. 3(E) in relation to FIGS. 3(C) and 3(D), a signal $e$ exists in periods wherein at least one of the two signals $c$ and $d$ is obtained as the output of the wave shaper 37. This signal $e$ is made into a control signal $f$, having a waveform as indicated in FIG. 3(F), by an integrator 38 having an instantaneous rising characteristic and having a characteristic of recovering gently over a suitable preset time (for example, 30 mili-sec.). This control signal $f$ is passed through buffer amplifiers 39a and 39b and then respectively applied to voltage-controlled variable-gain amplifiers (hereinafter described as gain control amplifiers) 42a and 42b.

As indicated in FIG. 3(G), angle-modulated wave signals ga and gb are introduced from the angle modulators 15a and 15b through input terminals 40a and 40b. The modulated signals pass through amplifiers 41a and 41b and then are supplied to the above mentioned gain control amplifiers 42a and 42b. There, their levels are controlled by the above mentioned control signal applied from the buffer amplifiers 39a and 39b. The input signals ga and gb are thus made into angle-modulated wave signals ha and hb having levels as indicated in FIG. 3(H). The angle-modulated wave signals ha and hb are thus level controlled and are respectively passed through amplifiers 43a and 43b and through output terminals 44a and 44b to the mixers 14a and 14b shown in FIG. 1.

Here, these angle-modulated wave difference signals ha and hb are thus level controlled. Their levels are high during periods when the levels of the high-frequency components of the direct wave sum signals Sa and Sb are high. For this reason, there is no interference when a multichannel record disc is reproduced. In other systems, the interference often occurs because the multiplexing of angle-modulated wave difference signals level interferes with the direct wave sum signals.

Figure 4:
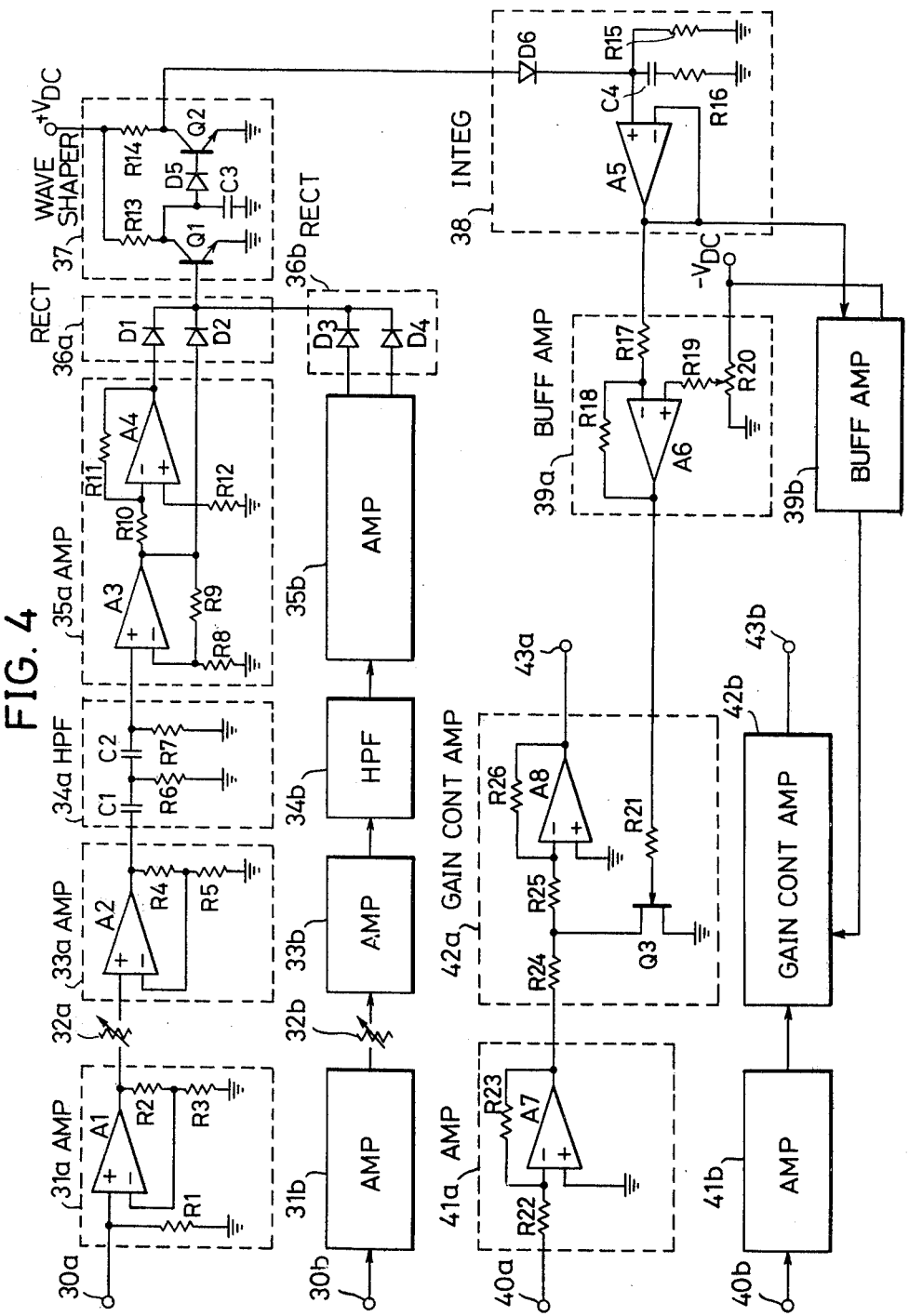
FIG. 4 is a circuit diagram showing one embodiment of a circuit which may be used to complete the block diagram shown in FIG. 2.

FIG. 4 shows one embodiment of a specific circuit for completing the block diagram shown in FIG. 2. Those parts which are the same as corresponding parts in FIG. 2 are designated by like reference numerals and subscripts. Almost all of the blocks are provided in pairs. The two blocks of each pair are identical and are designated by the same reference numeral but with distinguishing subscripts $a$ and $b$. FIG. 4 shows only the block designated by the subscript $a$. The other blocks, designated by the subscript $b$, form a pair and are shown in block form.

The sum signal Sa is introduced into the circuit (FIG. 4) through the input terminal 30a, amplified by the amplifier 31a comprising resistors R1, R2, and R3 and an amplifier A1. Then the signal passes through the level adjuster 32a, and is amplified by the amplifier 33a comprising resistors R4 and R5 and an amplifier A2. The signal thus amplified is fed to the high-pass filter 34a. The high-pass filter 34a comprises resistors R6 and R7 and capacitors C1 and C2 and passes only the particular high frequency range of the signal Sa, and supplies the same to the amplifier 35a. The amplifier 35a comprises an in-phase output amplifier circuit having resistors R8 and R9 and an amplifier A3 and an opposite-phase output amplifier circuit comprising resistors R10, R11, and R12, and an amplifier A4. An in-phase output signal and an opposite-phase output signal from the amplifier 35a are supplied respectively by way of diodes D1 and D2 of the rectifier 36a to the wave shaper 37. Similarly, the rectifier 36b also comprises diodes D3 and D4. The diodes D1 through D4 have commonly connected cathodes and constitute an OR gate.

The wave shaper 37 comprises resistors R13 and R14, transistors Q1 and Q2, a diode D5, and a capacitor C3. A desired waveform is provided by appropriately selecting the time constant determined by the resistor R13 and the capacitor C3 and the time constant determined by the capacitor C3 and the internal resistance of the transistor Q1. When transistor Q1 is ON, the signal e of the waveform indicated in FIG. 3(E) is obtained by the diode D5 and the transistor Q2. This waveshaped output signal e is introduced into the integration circuit 38.

The integration circuit 38 comprises a diode D6, resistors R15 and R16, a capacitor C4, and an amplifier A5. The rising time constant is determined by the resistor R14 and the capacitor C4, and is selected at an extremely small value. The recovering time constant is determined by the resistor R15 and the capacitor C4, and is selected at an appropriate value. In this connection, the relationship between the resistance values of the resistors R14, R15, and R16 is selected so that R14 << R15 and R14 >> R16. The input resistance of the amplifier A5 is at a high value. The diode D6 prevents a reverse flow of the signal at the recovering time.

The control signal f of the waveform indicated in FIG. 3(F), is derived from the integration circuit 38 and is fed to the buffer amplifier 39a and 39b. The amplifier 39a comprises resistors R17 through R20 and an amplifier A6. The resistors R19 and R20 impart a fixed bias voltage to a field effect transistor (FET) Q3, which is a voltage-controlled variable resistance element of the gain control amplifier 42a. The above mentioned control signal f undergoes phase inversion in the amplifier 39a and is impressed on the gate of the FET Q3.

The amplifier 41a comprises resistors R22 and R23 and an amplifier A7. The gain control amplifier 42a comprises resistors R21, R24, R25, and R26, the FET Q3, and an amplifier A8. The FET Q3 is connected to a negative feedback loop of the amplifier A8. The level of the angle-modulated wave signal imparted between the drain and source of the FET Q3 can be set at a relatively small value.

The transfer function G of the transmission system of the amplifier 41a and the gain-control amplifier 42 is expressed by the following equation.

$$G = \left(-\frac{Rb}{Ra}\right)\left(-\frac{Rf}{Rc + Re + \frac{Rc \cdot Re}{Rd}}\right).$$

where: Ra, Rb, Rc, Re, and Rf are respectively the resistance values of the resistors R22, R23, R24, R25, and R26; and Rd is the internal resistance value of the FET Q3.

When the control signal f is not present, only a fixed bias (due to the resistors R19 and R20) is applied to the gate of the FET Q3. On the other hand, when the control signal f is present, the voltage applied to the gate of the FET Q3 becomes a voltage which has been reduced from the fixed bias, and the internal resistance value Rd increases. Consequently, the transfer function (gain) of the transmission circuit becomes large. From the output terminal 43a, the signal ha is led out with a level control, as indicated in FIG. 3(H).

Further, this invention is not limited to these embodiments but various variations and modifications may be made without departing from the scope of the invention.

What we claim is:

1. A multichannel record disc recording system comprising:

means for supplying first, second, third and fourth channel signals;
   first operating means for forming a first sum signal and a first difference signal responsive to the first and second channel signals;
   second operating means for forming a second sum signal and a second difference signal responsive to the third and fourth channel signals;
   first modulating means for angle-modulating said first difference signal;
   second modulating means for angle-modulating said second difference signal;
   control signal forming means for forming a control signal responsive to a level of at least one of said first and second sum signals exceeding a predetermined level;
   first level control means responsive to said control signal for controlling the level of the first angle-modulated difference signal;
   second level control means responsive to said control signal for controlling the level of the second angle-modulated difference signal;
   first mixing means for multiplexing the first sum signal and the first level controlled angle-modulated difference signal to obtain a first multiplexed signal;
   second mixing means for multiplexing the second sum signal and the second level controlled angle-modulated difference signal to provide a second multiplexed signal; and
   recording means for recording the first and second multiplexed signals in one groove of a record disc.

2. A multichannel record disc recording system as claimed in claim 1 in which said control signal forming means detects when a level of a high frequency range of said first and second sum signals exceeds the predetermined level and for forming the control signal responsive thereto.

3. A multichannel record disc recording system as claimed in claim 1 in which said control signal forming means forms said control signal having a waveform which controls the first and second level control means to maintain the levels of the first and second angle-modulated difference signals at an increase above their original levels during time periods while the level of at least one of the first and second sum signals exceeds a predetermined level and thereafter gradually decreasing said maintained levels to the original levels.

4. A multichannel record disc recording system as claimed in claim 1 in which said control signal forming means comprises filtering means for passing a range of high frequency signal components of the first and second sum signals, means responsive to said filtering means for detecting when the levels of the high frequency range signal components exceed a predetermined level and for producing a detection output signal, means operating responsive to the detection output signal to form a control signal having a waveform with an instantaneous rising part and a gently falling part with a predetermined time constant after the elapse of said period, and means for applying the control signal to the level control means.

5. A multichannel record disc recording system as claimed in claim 1 in which said control signal forming means comprises first and second filtering means for respectively passing a high frequency range of signal components of the first and second sum signals, first and second rectifiers poled to pass signals during periods while the levels of said signals are above a predetermined level of the high frequency range of signal components thus filtered, the output sides of the rectifiers being connected together to form an OR gate, and an integrator means responsive to the signals passed through the first and second rectifier OR gate and forming a control signal having a waveform with an instantaneous rise and, after absence of said signals, a gentle fall with a specific time constant; and said control means comprises first and second gain control amplifiers supplied simultaneously with said control signal to control simultaneously the levels of the first and second angle-modulated difference signals, respectively, in accordance with the waveform of the control signal.

6. A multichannel record disc recording system as claimed in claim 1 in which said level control means comprises a voltage-controlled, variable-gain amplifier means having an amplifier with a feedback loop including a field effect transistor having an internal resistance which is varied responsive to an application of the control signal voltage to the gate thereof.

* * * * *